(12) United States Patent
Yamashita et al.

(10) Patent No.: US 10,793,952 B2
(45) Date of Patent: Oct. 6, 2020

(54) METHOD FOR FORMING SEALING FILM, AND SEALING FILM

(71) Applicant: TORAY ENGINEERING CO., LTD., Chuo-ku, Tokyo (JP)

(72) Inventors: Masamichi Yamashita, Otsu (JP); Takayoshi Fujimoto, Kusatsu (JP); Masaki Mori, Yasu (JP)

(73) Assignee: TORAY ENGINEERING CO., LTD., Tokyo (JP)

( * ) Notice: Subject to any disclaimer, the term of this patent is extended or adjusted under 35 U.S.C. 154(b) by 111 days.

(21) Appl. No.: 15/510,845

(22) PCT Filed: Oct. 29, 2015

(86) PCT No.: PCT/JP2015/080475
§ 371 (c)(1),
(2) Date: Mar. 13, 2017

(87) PCT Pub. No.: WO2016/076119
PCT Pub. Date: May 19, 2016

(65) Prior Publication Data
US 2017/0283951 A1 Oct. 5, 2017

(30) Foreign Application Priority Data
Nov. 14, 2014 (JP) ................. 2014-232014

(51) Int. Cl.
*C23C 16/50* (2006.01)
*H01L 31/048* (2014.01)
(Continued)

(52) U.S. Cl.
CPC ............. *C23C 16/50* (2013.01); *B32B 7/02* (2013.01); *C23C 16/0272* (2013.01);
(Continued)

(58) Field of Classification Search
CPC .................................................. C23C 16/0272
See application file for complete search history.

(56) References Cited

U.S. PATENT DOCUMENTS 5,523,616 A * 6/1996 Den ................ H01L 23/3171
257/637
5,985,759 A * 11/1999 Kim ................ C23C 14/0641
257/E21.169
(Continued)

FOREIGN PATENT DOCUMENTS

JP 05-335299 A 12/1993
JP 07-130731 A 5/1995
(Continued)

OTHER PUBLICATIONS

International Search Report of the corresponding International Application No. PCT/JP2015/080475, dated Jan. 26, 2016.

*Primary Examiner* — David P Turocy
(74) *Attorney, Agent, or Firm* — Global IP Counselors, LLP (57) ABSTRACT

A method for forming a sealing film, in which a buffer layer and a barrier layer whose density is higher than that of the buffer layer are alternately formed on a substrate, includes forming a first buffer layer on a surface of the substrate, forming a first barrier layer on a surface of the first buffer layer, and forming a second buffer layer on a surface of the first barrier layer. A ratio of a thickness of a portion of the first buffer layer in a thickness direction of the substrate relative to a thickness of a portion of the first buffer layer in an inclined direction that is inclined with respect to the thickness direction is closer to 1 than a ratio of a thickness of a portion of the second buffer layer in the thickness direction relative to a thickness of a portion of the second buffer layer in the inclined direction.

7 Claims, 4 Drawing Sheets

(51) Int. Cl.
*B32B 7/02* (2019.01)
*C23C 16/455* (2006.01)
*H01L 31/0392* (2006.01)
*C23C 16/02* (2006.01)
*C23C 16/54* (2006.01)

(52) U.S. Cl.
CPC ...... *C23C 16/45523* (2013.01); *C23C 16/545* (2013.01); *H01L 31/03926* (2013.01); *H01L 31/048* (2013.01); *Y02E 10/50* (2013.01)

(56) References Cited

U.S. PATENT DOCUMENTS

| | | | | |
|---|---|---|---|---|
| 6,203,863 | B1* | 3/2001 | Liu | C23C 16/045 |
| | | | | 257/E21.279 |
| 6,759,323 | B2* | 7/2004 | Kirchhoff | C23C 16/045 |
| | | | | 438/627 |
| 2008/0085418 | A1* | 4/2008 | Fukuda | B32B 7/02 |
| | | | | 428/447 |
| 2009/0053491 | A1* | 2/2009 | Loboda | H01L 21/02126 |
| | | | | 428/216 |
| 2010/0075150 | A1* | 3/2010 | Takahashi | C23C 16/345 |
| | | | | 428/411.1 |
| 2012/0003500 | A1* | 1/2012 | Yoshida | C23C 14/10 |
| | | | | 428/688 |
| 2015/0027531 | A1* | 1/2015 | Yamashita | H01L 31/03926 |
| | | | | 136/256 |

FOREIGN PATENT DOCUMENTS

| | | |
|---|---|---|
| JP | 2010-180434 A | 8/2010 |
| JP | 2013-185207 A | 9/2013 |
| WO | WO-2013132890 A1 * 9/2013 | ....... H01L 31/03926 |

\* cited by examiner

METHOD FOR FORMING SEALING FILM, AND SEALING FILM

CROSS-REFERENCE TO RELATED APPLICATIONS

This application is a U.S. National stage of International Application No. PCT/JP2015/080475 filed on Oct. 29, 2015. This application claims priority to Japanese Patent Application No. 2014-232014 filed with Japan Patent Office on Nov. 14, 2014. The entire disclosure of Japanese Patent Application No. 2014-232014 is hereby incorporated herein by reference.

BACKGROUND

Field of the Invention

The present invention relates to a method for forming a sealing film on a substrate in order to prevent water from penetrating to the substrate, and to a sealing film that is formed on a substrate.

Background Information

Films with attached sealing films, formed for the purpose of preventing oxidation, moisture permeation, etc., have been used in recent years on the surface of plastic films.

With a sealing film-attached film such as this, as discussed in Japanese Laid-Open Patent Application Publication No. 2013-185207 (Patent Literature 1), a buffer layer with good adhesion and a barrier layer with good a barrier property with respect to the penetration of moisture are alternately laminated, thus forming on the base film a sealing film that is both flexible and provides a good barrier. In forming this sealing film, the buffer layer and barrier layer are mainly laminated by plasma CVD.

SUMMARY

Figure 5:
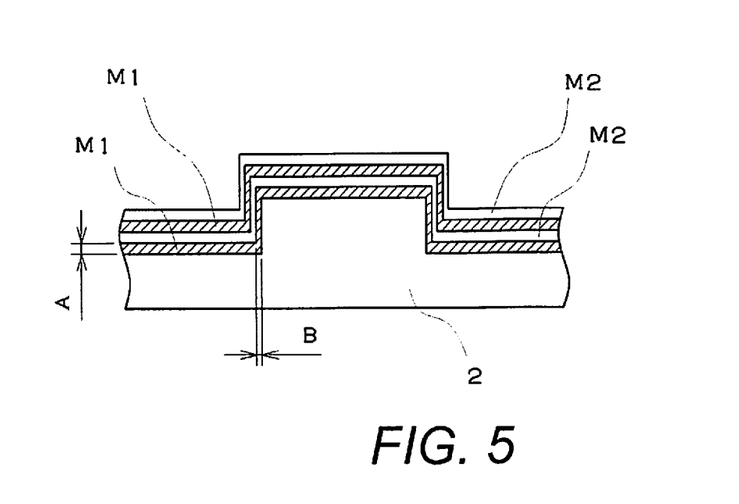
FIG. 5 is a simplified view of the structure of a conventional sealing film.

With the above-mentioned thin-film formation device, however, there is the risk that the barrier property of the sealing film thus formed would be poor. More specifically, when a sealing film is formed by plasma CVD, if there is a stepped part such as an under-layer on the substrate 2 as shown in FIG. 5, buffer layers M1 and barrier layers M2 are formed so as to conform to this stepped part, but the thickness (the thickness B in FIG. 5) of the portion conforming to the stepped part (the portion formed in a direction that is inclined with respect to the thickness of the substrate 2) tends to be less than the thickness of the portion formed in the thickness direction of the substrate 2 (the thickness A in FIG. 5). In this case, there is the possibility that the buffer layer M1 will not be formed properly on the surface of the stepped part of the substrate 2, and since the barrier layer that is subsequently formed will not adhere well to this portion that is not formed properly, a problem is that the sealing film ends up having extremely poor barrier properties.

The present invention is conceived in light of the above problem, and it is an object thereof to provide a method for forming a sealing film with which a sealing film having a good barrier property can be formed stably.

To solve the above problem, the sealing film formation method of the present invention is a method for forming a sealing film in which a buffer layer and a barrier layer whose density is higher than that of the buffer layer are alternately formed on a substrate, said method comprising a first buffer layer formation step of forming the buffer layer on the surface of a substrate, a first barrier layer formation step of forming the barrier layer on the surface of a first buffer layer that is the buffer layer formed in the first buffer layer formation step, and a second buffer layer formation step of forming the buffer layer on the surface of a first barrier layer that is the barrier layer formed in the first barrier layer formation step, wherein the ratio of the thickness of the portion of the first buffer layer formed in the thickness direction of the substrate relative to the thickness of the portion formed in a direction that is inclined with respect to said thickness direction is closer to 1 than the ratio of the thickness of the portion of the second buffer layer, which is the buffer layer formed in the second buffer layer formation step, formed in the thickness direction relative to the thickness of the portion formed in a direction that is inclined with respect to the thickness direction.

With the above-mentioned method for forming a sealing film, because the ratio of the thickness of the portion of the first buffer layer formed in the thickness direction of the substrate relative to the thickness of the portion formed in a direction that is inclined with respect to said thickness direction is closer to 1 than the ratio of the thickness of the portion of the second buffer layer, which is the buffer layer formed in the second buffer layer formation step, formed in the thickness direction relative to the thickness of the portion formed in a direction that is inclined with respect to the thickness direction, the first buffer layer can be reliably formed even on a portion of the substrate that is not flat, so a sealing film with a good barrier property can be formed stably.

Also, it is preferable if the buffer layer and the barrier layer are formed by CVD, and the film formation pressure in the first buffer layer formation step is higher than the film formation pressure in the second buffer layer formation step.

As a result, the first buffer layer and the second buffer layer can be formed using the same formation chamber, and the sealing film pertaining to the present invention can be easily formed.

Also, to solve the above problem, the sealing film of the present invention is a sealing film formed by alternately forming a buffer layer and a barrier layer whose density is higher than that of the buffer layer on a substrate, said sealing film comprising a first buffer layer that is the buffer layer formed on the surface of the substrate, a first barrier layer that is the barrier layer formed on the surface of the first buffer layer, and a second buffer layer that is the buffer layer formed using the same raw material as the first buffer layer on the surface of the first barrier layer, wherein the ratio of the thickness of the portion of the first buffer layer formed in the thickness direction of the substrate relative to the thickness of the portion formed in a direction that is inclined with respect to said thickness direction is closer to 1 than the ratio of the thickness of the portion of the second buffer layer formed in the thickness direction relative to the thickness of the portion formed in a direction that is inclined with respect to the thickness direction.

With the above sealing film, because the ratio of the thickness of the portion of the first buffer layer formed in the thickness direction of the substrate relative to the thickness of the portion formed in a direction that is inclined with respect to said thickness direction is closer to 1 than the ratio of the thickness of the portion of the second buffer layer formed in the thickness direction relative to the thickness of the portion formed in a direction that is inclined with respect to the thickness direction, the first buffer layer can be reliably formed even on a portion of the substrate that is not flat, so a sealing film with a good barrier property can be formed stably.

With the method of the present invention for forming a sealing film, a sealing film having a good barrier property can be formed stably.

DETAILED DESCRIPTION OF EMBODIMENTS

An embodiment pertaining to the present invention will now be described through reference to the drawings.

Figure 1:
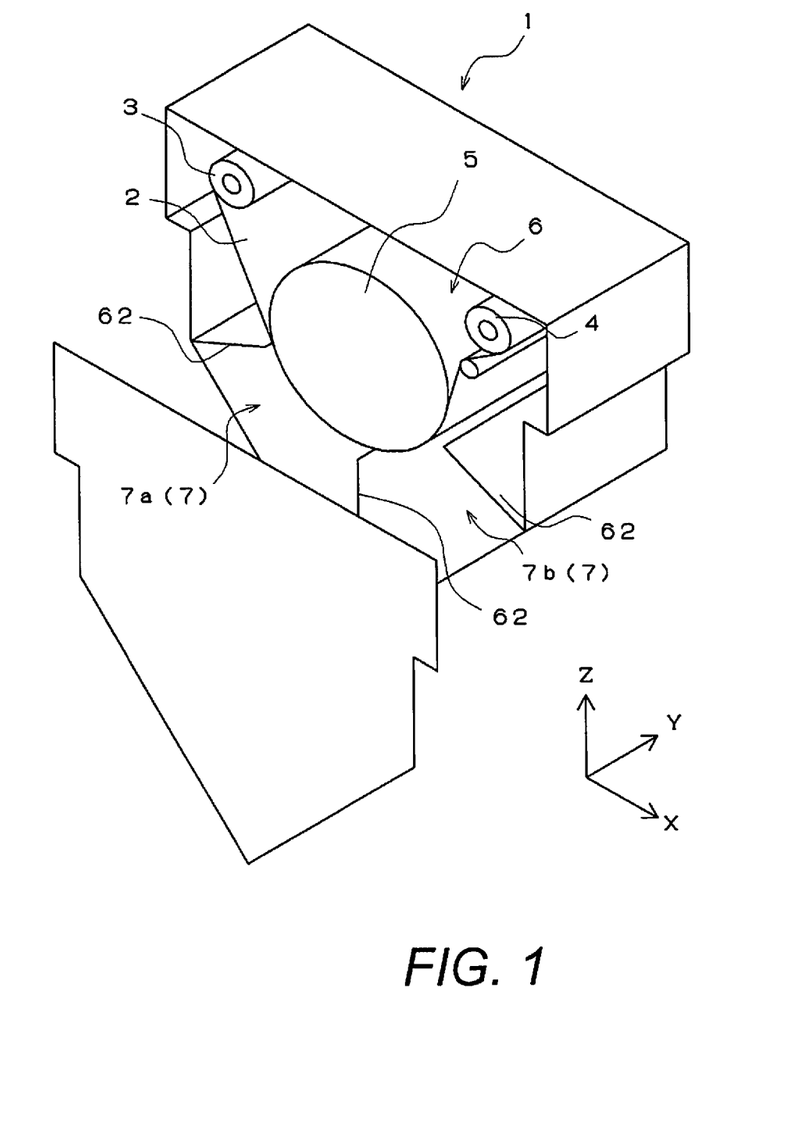
FIG. 1 is a simplified view of a thin-film formation device for implementing a sealing film formation method in an embodiment of the present invention, and is an oblique view.
Figure 2:
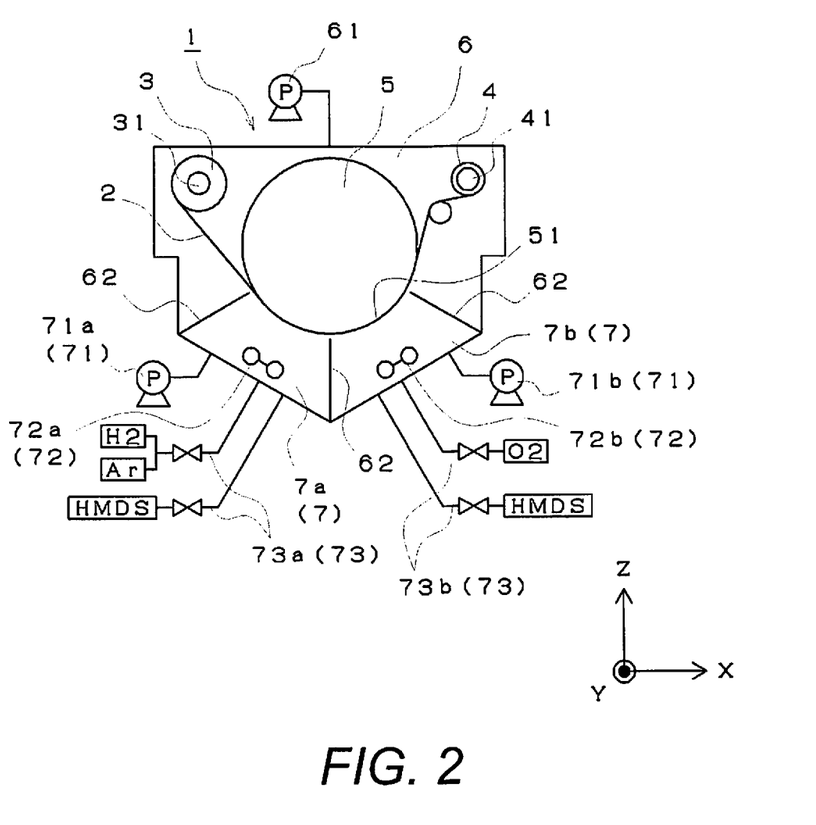
FIG. 2 is a simplified view of a thin-film formation device for implementing a sealing film formation method in an embodiment of the present invention, and is a front view.

FIGS. 1 and 2 are simplified diagrams of a thin-film formation device 1 for implementing the sealing film formation method in an embodiment of the present invention.

A thin-film formation device 1 is used to form a thin-film by performing surface treatment on a substrate. For example, a sealing film whose purpose is to prevent oxidation, moisture permeation, etc., is formed on a plastic film, and the product is used as a protective film for foods, a flexible solar cell, or the like. More specifically, in the case of a flexible solar cell, a solar cell made up of various electrode layers, opto-electrical conversion layers, and so forth is formed on a plastic film or other substrate, after which buffer layers and barrier layers (discussed below) are laminated over the solar cell with the thin-film formation device 1 to form a sealing film. Consequently, moisture is effectively prevented from penetrating to the solar cell, and a flexible solar cell with excellent oxidation resistance can be formed.

This thin-film formation device 1 has a conveyor roll 3 for playing out a band-shaped substrate 2, a conveyor roll 4 for winding up the supplied substrate 2, a main roll 5 disposed between the conveyor roll 3 and the conveyor roll 4, a main roll chamber 6 that houses these rolls, and film formation chambers 7 in which a thin-film is formed. The substrate 2 played out from the conveyor roll 3 is conveyed along the outer peripheral face 51 of the main roll 5 while passing through the film formation chambers 7, which forms a thin-film on the substrate 2, and this is wound onto the conveyor roll 4.

The conveyor roll 3 and the conveyor roll 4 have a substantially circular-cylindrical core 31 and core 41. The substrate 2 is wounded onto the core 31 and the core 41, and these cores 31 and 41 are rotationally driven to play out or wind up the substrate 2. That is, the speed at which the substrate 2 is played out or wound up can be increased and decreased by controlling the rotation of the cores 31 and 41 with a control device (not shown). More specifically, when the core on the upstream side is rotated in a state in which the substrate 2 is under tension from the downstream side, the substrate 2 is played out on the downstream side, and the core on the upstream side is braked as needed so that the substrate 2 will be played out at a constant speed without sagging. Also, the rotation of the core on the downstream side is adjusted to prevent sagging of the played-out substrate 2, and conversely the substrate 2 can be wound up without being subjected to more tension than necessary.

The substrate 2 here is a long, slender thin-film that extends in one direction, and a strip with a flat shape having a thickness of 0.01 mm to 0.2 mm and a width of 5 mm to 1000 mm is used. There are no particular restrictions on the material, but stainless steel, copper, and other such metal materials, or a plastic film or the like can be used to advantage.

The conveyor roll 3 and the conveyor roll 4 thus form a pair, one of which plays out the substrate 2, and the other of which winds the substrate 2 at the same speed as the playout speed, which makes it possible to convey the substrate 2 while keeping tension applied to the substrate 2 at a specific value. A mode is given above in which the conveyor roll 3 played out the substrate 2 and the conveyor roll 4 wound up the substrate 2, but the rotational direction of the conveyor roll 3 and the conveyor roll 4 can be reversed so that the conveyor roll 4 plays out the substrate 2 and the conveyor roll 3 winds up the substrate 2, thus reversing the conveyance direction of the substrate 2.

The main roll 5 is a conveyor that holds the substrate 2 in a constant orientation during film formation, while conveying the substrate 2 supplied from the conveyor roll on the upstream side to the conveyor roll on the downstream side. The main roll 5 is disposed between the conveyor roll 3 and the conveyor roll 4, and is in the form of a substantially circular cylinder that is larger in diameter than the core 31 and the core 41. The outer peripheral face 51 of the main roll 5 is formed as a curved surface with a constant radius of curvature in the peripheral direction, and its drive is controlled by a control device (not shown) according to the rotation of the core 31 and the core 41. The substrate 2 played out from the conveyor roll on the upstream side comes into contact with the outer peripheral face 51 of the main roll 5 and is thereby conveyed in a state in which a specific tension is applied. Specifically, the main roll 5 rotates according to the rotation of the conveyor roll 3 and the conveyor roll 4 in a state in which the substrate 2 is touching the outer peripheral face 51 of the main roll 5, the result being that the substrate 2 is conveyed from the conveyor roll on the upstream side to the conveyor roll on the downstream side in a state in which the entire substrate 2 is being tensioned and in an orientation in which the surface of the substrate 2 is opposite the film formation chambers 7. Thus forming the film while the substrate 2 is conveyed in a taut state prevents the substrate 2 from fluttering during film formation, which allows the thin-film laminated on the substrate 2 to be formed in a more uniform thickness, and also prevents particles from being generated by the fluttering of the substrate 2. Also, because the radius of curvature of the main roll 5 is set larger, film formation is carried out while the substrate 2 is supported in a state that is closer to being flat, which prevents the substrate 2 from warping after film formation.

The main roll chamber 6 is used to hold the main roll 5 and maintain the inside of the chamber at a constant pressure. In this embodiment, as shown in FIG. 1, the main roll chamber 6 is a casing formed in a substantially pentagonal shape (roughly the shape of a baseball home plate), with the main roll 5 accommodated in the center portion thereof. A vacuum pump 61 is connected to the main roll chamber 6, and this vacuum pump 61 can be actuated to control the pressure inside the main roll chamber 6. In this embodiment, the pressure is set to be lower than that in the film formation chambers 7. Also, in this embodiment, the conveyor roll 3 and the conveyor roll 4 are housed in the main roll chamber 6, but they may instead be provided outside the main roll chamber 6. Providing them inside the main roll chamber 6 as in this embodiment protects the substrate 2 and the substrate 2 after film formation (the film-attached substrate) against exposure to the atmosphere.

The film formation chambers 7 are used to form a thin-film on the substrate 2. In this embodiment, two film formation chambers 7 with the same structure are provided. These film formation chambers 7 are provided within the main roll chamber 6, and in the present invention the one closer to the conveyor roll 3 is called the first film formation chamber 7a and the one closer to the conveyor roll 4 is called the second film formation chamber 7b. When it is unnecessary to distinguish between the first film formation chamber 7a and the second film formation chamber 7b, they are referred to collectively as the film formation chambers 7.

The first film formation chamber 7a and the second film formation chamber 7b are formed by disposing partitions 62 on the outside of the main roll 5. More specifically, three substantially flat partitions 62 are provided on the outside of the main roll 5, extending toward the outer peripheral face 51 of the main roll 5, thereby forming the two film formation chambers 7 that are formed by the outer peripheral face 51 of the main roll 5, the partitions 62, and the walls of the main roll chamber 6, surround part of the film formation surface of the substrate 2 on the main roll 5 (the face on the opposite side from the face that touches the main roll), and form a closed space between themselves and part of said film formation surface. Consequently, when the substrate 2 is conveyed along the main roll 5 from the conveyor roll 3 to the conveyor roll 4, for example, the substrate 2 that passes the first partition 62 is conveyed into the first film formation chamber 7a, and then the substrate that passes the second partition 62 is conveyed into the second film formation chamber 7b, thereby successively forming thin-films on the substrate 2 in the first film formation chamber 7a and the second film formation chamber 7b.

This embodiment is configured such that a slight gap is provided between the substrate 2 on the main roll 5 and the ends of the partitions 62 in order to prevent damage to the substrate 2 due to interference between the partitions 62 and the substrate 2. Therefore, the space formed between the film formation chambers 7 and the substrate 2 is not a closed space in a strict sense, but for the purposes of this description we shall call it a closed space even though it is actually a space with these slight gaps.

Vacuum pumps 71a and 71b are connected to the film formation chambers 7, and the vacuum pumps 71a and 71b can be actuated to set the interior of the first film formation chamber 7a and the second film formation chamber 7b to a specific pressure. In this embodiment, the inside of the film formation chambers 7 is reduced to a specific pressure before the raw material gas is supplied.

Also, these film formation chambers 7 are provided with a film formation source featuring plasma CVD, as a surface treatment of the substrate 2. Specifically, the film formation chambers 7 are provided with substantially U-shaped plasma electrodes 72a and 72b that are connected to a high-frequency power supply (not shown) and are used for generating a plasma in the closed space within the film formation chambers 7, and these are connected to raw material gas pipes 73a and 73b, which are raw material gas supply means. More specifically, the first film formation chamber 7a is provided with the plasma electrode 72a, which is connected to a high-frequency power supply, and the second film formation chamber 7b is provided with the plasma electrode 72b, which is connected to a high-frequency power supply. Also, the first film formation chamber 7a is connected to raw material gas pipes 73a and an electrical discharge-use gas pipe (not shown), and the second film formation chamber 7b is connected to raw material gas pipes 73b and an electrical discharge-use gas pipe (not shown). Consequently, a specific thin-film is formed on the substrate 2 passing through the first film formation chamber 7a and the second film formation chamber 7b. That is, in a state in which raw material gas and discharge-use gas have been supplied into the film formation chambers 7, a high-frequency voltage is applied to the plasma electrodes 72 by a high-frequency power supply, which generates a plasma in the discharge-use gas around the plasma electrodes 72. The raw material gas is decomposed by this plasma, reaches the substrate 2, and forms a specific thin-film on the substrate 2. In this embodiment, in the first film formation chamber 7a, HMDS (hexamethyldisilazane) gas, argon gas, and hydrogen gas are supplied as the raw material gas to form a silicon component film (buffer layer), and in the second film formation chamber 7b, HMDS and oxygen gas are supplied as the raw material gas to form a dense $SiO_2$ film (barrier layer). Incidentally, when there is no need to distinguish between the vacuum pumps 71a and 71b, between the plasma electrodes 72a and 72b, and between the raw material gas pipes 73a and 73b, they will be collectively referred to as the vacuum pumps 71, the plasma electrodes 72, and the raw material gas pipes 73, respectively.

Here, the buffer layer is lower in density and higher in adhesion than the barrier layer, and the barrier layer, which is conversely higher in density than the buffer layer, has a better barrier property.

With the thin-film formation device 1 configured as above, when the substrate 2 is first conveyed from the conveyor roll 3 to the conveyor roll 4, the substrate 2 passes through the first film formation chamber 7a, where a buffer layer is formed. The substrate 2 on which the buffer layer has been formed then passes through the second film formation chamber 7b, where a barrier layer is formed over the buffer layer. As a result of continuing this conveyance from the conveyor roll 3 to the conveyor roll 4, most of the substrate 2 that had been wound onto the core 31 of the conveyor roll 3 moves to the core 41 of the conveyor roll 4, and a buffer layer and barrier layer are laminated over substantially the entire surface of the substrate 2, and then the rotation direction of the core 31 and the core 41 is then reversed, the conveyance direction of the substrate 2 reverses, and the substrate 2 goes back through the second film formation chamber 7b and the first film formation chamber 7a, so another buffer layer is laminated over the barrier layer. After this, the conveyance direction of the substrate 2 is again reversed to form another barrier layer on the buffer layer, and thin-films are formed in the two film formation chambers 7 while reversing the conveyance direction of the substrate 2, thereby allowing two types of thin-film to be laminated alternately. This means that a sealing film providing both good barrier property and good adhesion can be formed on the substrate 2.

Figure 3:
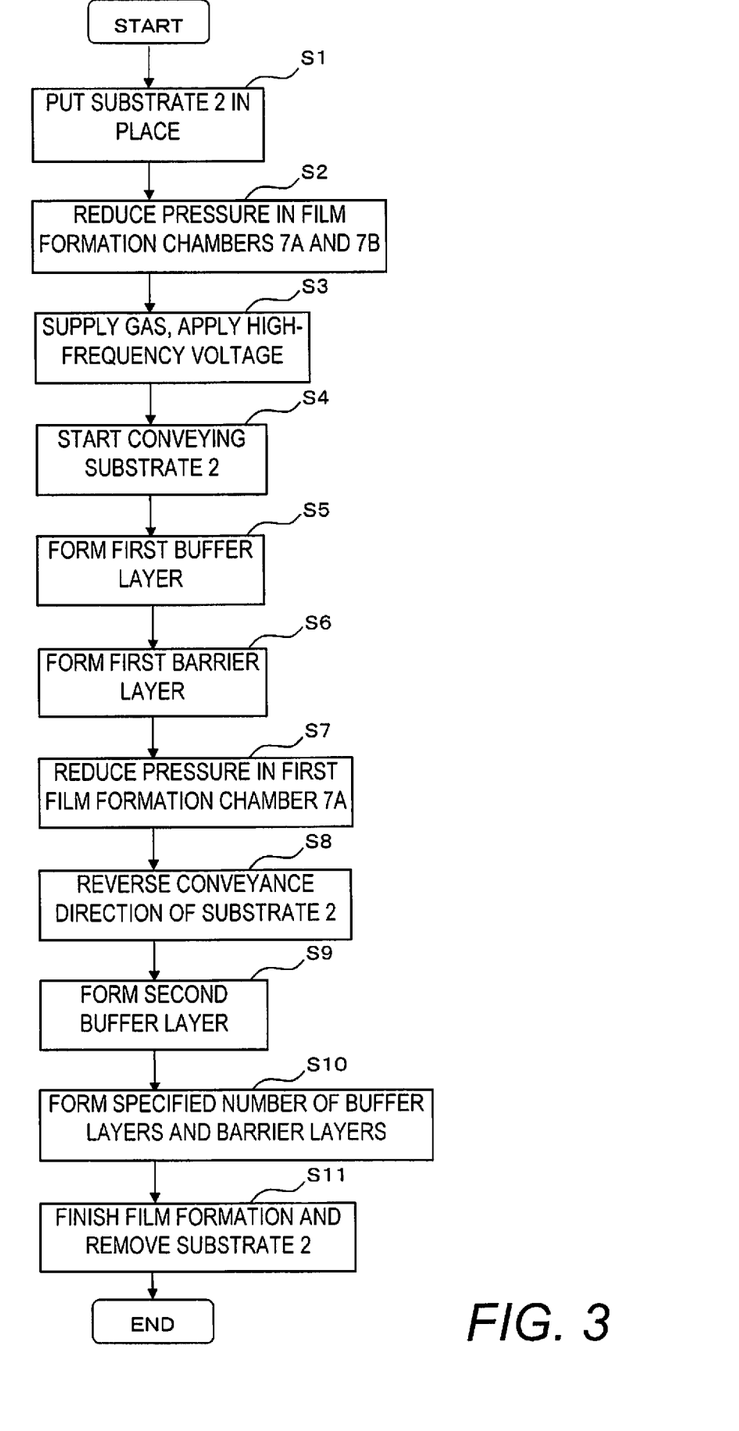
FIG. 3 is a flowchart of the operations in the sealing film formation method in an embodiment of the present invention.

The operational flow of a method for forming a sealing film on the substrate 2 using the above-mentioned thin-film formation device 1 will now be described through reference to FIG. 3.

First, a substrate 2 that has been wound onto the core 31 of the conveyor roll 3 is set in place, and the substrate 2 is placed on the outer peripheral face 51 of the main roll 5, and then connected to the core 41 of the conveyor roll 4 (step S1). The main roll chamber 6 and the vacuum pumps 61 and 71 of the film formation chambers 7 are then actuated, and the insides of the film formation chambers 7 are brought to the specified pressure (step S2). The pressure inside the first film formation chamber 7a here first becomes the pressure P1 necessary to form a buffer layer on the surface of the substrate 2 (film formation surface). More specifically, this pressure P1 is about a few dozen pascals.

After the chambers have reached the specified pressure, raw material gas and discharge gas are supplied from the raw material gas pipes 73 of the film formation chambers 7 and from discharge gas pipes (not shown), and high-frequency voltage is applied to the plasma electrodes 72 by a high-frequency power supply (step S3). At this point the gas is supplied and is then decomposed by the plasma, so that the pressure in the film formation chambers 7 becomes higher than before the gas is supplied, and therefore, in the above-mentioned step S2, this is taken into account and the pressure is reduced in the film formation chambers 7 so that the internal pressure of the film formation chambers 7 after gas supply will be the pressure that is set for thin-film formation.

Next, the conveyor roll 3 and the conveyor roll 4 are driven to commence the conveyance of the substrate 2 from the conveyor roll 3 toward the conveyor roll 4 (step S4).

The substrate 2 conveyed from the conveyor roll 3 toward the conveyor roll 4 first moves into the first film formation chamber 7a. In the first film formation chamber 7a, the raw material gas decomposed by exposure to the plasma atmosphere comes into contact with the substrate 2, and a buffer layer is formed on the film formation surface of the substrate 2. That is, the substrate 2 touches the raw material gas while being conveyed over the outer peripheral face 51 of the main roll 5, and a buffer layer is formed in the lengthwise direction on the film formation surface of the substrate 2 (step S5). The buffer layer thus formed directly on the film formation surface of the substrate 2 is called the first buffer layer in the present invention, and the step of forming this first buffer layer is called the first buffer layer formation step in the present invention.

The substrate 2 that has passed through the first film formation chamber 7a then goes into the second film formation chamber 7b. In the second film formation chamber 7b, the raw material gas that decomposed by exposure to the plasma atmosphere comes into contact with the substrate 2, forming a barrier layer over the first buffer layer (step S6). The barrier layer thus formed on the surface of the first buffer layer is called the first barrier layer in the present invention, and the step of forming this first barrier layer is called the first barrier layer formation step in the present invention. After the first buffer layer and the first barrier layer have been laminated and formed on the substrate 2, the substrate 2 is wound onto the conveyor roll 4.

Then, after nearly all of the substrate 2 has been wound onto the conveyor roll 4, the pressure in the first film formation chamber 7a, in which the buffer layer is formed, is further lowered to a pressure P2 that is lower than the above-mentioned pressure P1 (step S7). In specific terms, this pressure P2 is about a few pascals. The method for lowering the pressure in the first film formation chamber 7a may, for example, be to change the aperture of a valve and thereby raise the amount of exhaust gas produced by the vacuum pump 71a, or to reduce the amounts in which the raw material gas and the discharge-use gas are supplied.

Next, the rotational direction of the conveyor roll 3 and the conveyor roll 4 is reversed, and the conveyance direction of the substrate 2 is reversed (step S8).

The substrate 2 that is conveyed from the conveyor roll 4 toward the conveyor roll 3 when the conveyance direction is reversed first passes through the second film formation chamber 7b, which increases the thickness of the first barrier layer, after which the substrate 2 enters the first film formation chamber 7a, and a buffer layer is formed on the surface of the first barrier layer under conditions in which the pressure in the chamber is P2 (step S9). The buffer layer thus formed over the first barrier layer is called the second buffer layer in the present invention, and the step of forming this second buffer layer is called the second buffer layer formation step in the present invention.

After this, barrier layers and buffer layers are formed while repeatedly reversing the conveyance direction of the substrate 2, the result being that a sealing film in which the specified numbers of buffer layers and barrier layers have been alternately formed is formed on the film formation surface of the substrate 2 (step S10). Thus, a sealing film produced by alternately laminating buffer layers, which have better adhesion than the barrier layers, and barrier layers, which have a better barrier property than the buffer layers, combines the advantages of both the buffer layers and the barrier layers, and therefore has both good barrier property and good adhesion. The pressure inside the first film formation chamber 7a after the second buffer layer formation step is equal to the pressure P2 in the second buffer layer formation step, that is, it is lower than the pressure P1 in the first buffer layer formation step, and the pressure inside the second film formation chamber 7b is kept constant (at the pressure in the first barrier layer formation step).

Finally, after the voltage applied to the plasma electrodes 72 drops to zero and the plasma is extinguished in the film formation chambers, the entire substrate 2 has been wound onto one of the conveyor rolls, and said conveyor roll is then removed from the thin-film formation device 1 and the substrate 2 is sent to the next step (step S11).

Figure 4:
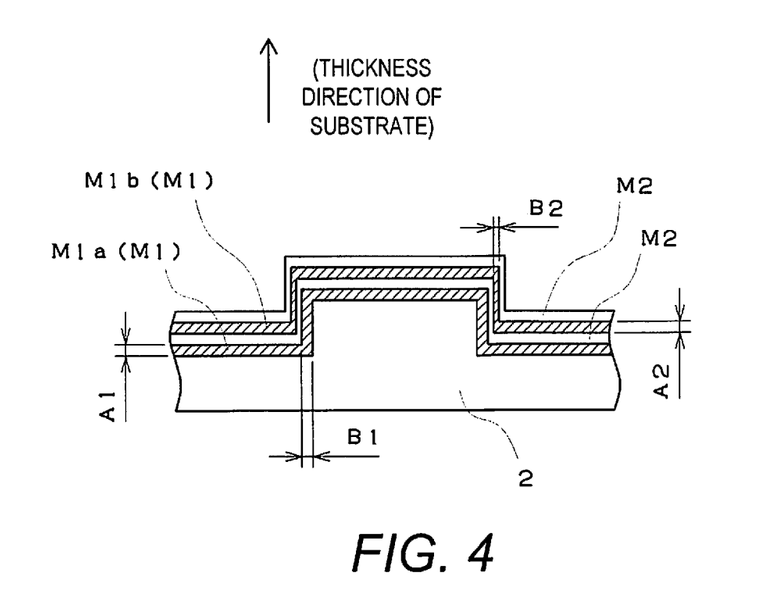
FIG. 4 is a simplified view of the structure of the sealing film of the present invention.

Next, the structure of the sealing film obtained by the method for forming a sealing film pertaining to the present invention is shown in FIG. 4.

Buffer layers M1 and barrier layers M2 are alternately laminated on the surface (the film formation surface) of the substrate 2 by means of the above-mentioned sealing film formation method. Here, as discussed above, the pressure in the first film formation chamber 7a in the first buffer layer formation step of laminating the first buffer layer M1a is higher than the pressure in the first film formation chamber 7a in the second buffer layer formation step of laminating the second buffer layer M1b. Consequently, even though the two buffer layers are formed from the same raw material, the film formation states are different. More specifically, even though the thickness A1 of the first buffer layer M1a is the same as the thickness A2 of the second buffer layer M1b in the thickness direction of the substrate 2 indicated by an arrow in FIG. 4, the thickness B1 of the first buffer layer M1a is greater than the thickness B2 of the second buffer layer M1b in a direction that is inclined to the thickness direction of the substrate 2. That is, the ratio of the thickness of the portion of the first buffer layer M1a formed in the thickness direction of the substrate 2 relative to the thickness of the portion formed in a direction that is inclined to said thickness direction, which is expressed by the quotient of dividing the thickness B1 by the thickness A1 (B1/A1), is closer to 1 than the ratio of the thickness of the portion of the second buffer layer M1b formed in the thickness direction relative to the thickness of the portion formed in a direction that is inclined to this thickness direction, which is expressed by the quotient of dividing the thickness B2 by the thickness A2 (B2/A2).

Thus forming the films so that the thickness B1, thickness of the first buffer layer M1a in a direction that is inclined to the thickness direction of the substrate 2, is made thicker allows the first buffer layer M1a to be formed in a sufficient thickness even on the surface of the stepped portion of the substrate 2. Consequently, the first buffer layer M1a is formed without any missing parts, so this avoids the problem of the barrier layer that is subsequently formed not sticking.

One reason here for raising the pressure in the first film formation chamber 7a to increase the thickness of the buffer layers M1 in a direction that is inclined to the thickness direction of the substrate 2 would be to shorten the mean free path of the raw material gas by raising the pressure, which allows the raw material gas to easily reach not only portions formed in the thickness direction of the substrate 2, but also portions that are inclined by about 90 degrees to the thickness direction, as shown in FIG. 4, for example. Also, when the pressure rises, the electron temperature drops and the reactivity of the raw material gas becomes lower, so not only does much of the raw material adhere to portions that are reached linearly from the direction of the plasma electrode 72a, but also much of the raw material adheres to portions that are reached indirectly when the raw material bounces off the surface of the thin-film, such as a portion that is inclined by 90 degrees to the thickness direction.

However, with the discharge gas that is converted into a plasma under conditions of high pressure in the first film formation chamber 7a, the discharge gas molecules have less energy, so there is the risk that undecomposed raw material gas will increase when the raw material gas is decomposed in this low-energy plasma. If this happens, the undecomposed raw material gas will form a thin-film (buffer layer) in a state in which impurities remain in its interior, so the film density will be lower, and as a result there is the risk of an inferior barrier property. Accordingly, it is undesirable for all of the buffer layer in the sealing film to be in a state such as this.

Therefore, if film formation is carried out under conditions in which the pressure in the first film formation chamber 7a is high only for the first buffer layer M1a, giving more importance to coverage (whether or not the substrate 2 can be evenly covered), so that the film is formed by increasing the coverage at the expense of the barrier property, and the subsequent buffer layers M1 are formed under conditions in which the pressure in the first film formation chamber 7a is lower, then a sealing film can be stably formed on the substrate 2 with almost not decrease in the barrier property of the sealing film as a whole. Also, the sealing film will be less likely to become too thick.

Also, if the configuration is such that both the first buffer layer M1a and any other buffer layers M1 are formed by varying the pressure in the first film formation chamber 7a, it will be possible to form the entire sealing film within a single thin-film formation device, and compared to when a sealing film is formed by replacing the substrate 2 in a number of devices, particles are prevented from becoming stuck between the buffer layers M1 and the barrier layers M2, and since both the first buffer layer M1 a and other buffer layers M1 can be formed from the same raw material gas, the cost of the raw material gas used for sealing film formation can be kept low.

The above method for forming a sealing film makes it possible to stably form a sealing film having a good barrier property.

In the above description, all of the buffer layers M1 are formed in a single first film formation chamber 7a by reversing the conveyance direction of the substrate 2, but it is also possible to dispose film formation chambers for forming the buffer layers M1 and film formation chambers for forming the barrier layers M2 alternately and in series in the conveyance direction of the substrate 2, and set the pressure in just the chamber for forming the first buffer layer M1a higher than the pressure in the film formation chambers for forming the other buffer layers.

Also, an example is given above in which film formation is performed using plasma CVD, but thermal CVD, MOCVD, or another such vacuum film formation method may be used instead of plasma CVD.

Also, if we focus only on the fact that the thickness of the buffer layers M1 is increased in a direction that is inclined to the thickness direction of the substrate 2 for just the first buffer layer M1a, then the formation of the first buffer layer M1a may be performed in a step other than plasma CVD, such as coating, and the lamination of the barrier layers M2 and the buffer layers M1 may be performed subsequently with the thin-film formation device 1 discussed above.

Also, in the above description, two thin-films of the buffer layers M1 and the barrier layers M2 are alternately laminated, but three or more types of thin-film may instead be formed in order.

The invention claimed is:

1. A sealing film formed by alternately forming a buffer layer and a barrier layer whose density is higher than that of the buffer layer on a substrate having a stepped portion on an upper surface of the substrate, the upper surface of the substrate facing in a thickness direction of the substrate, the stepped portion having a side surface facing in an inclined direction that is inclined with respect to the thickness direction, the sealing film comprising:
 a first buffer layer disposed on the substrate, the first buffer layer having
  a first part that is disposed on the upper surface of the substrate and has a first constant thickness measured between the upper surface of the substrate and an upper surface of the first part in the thickness direction, with the upper surface of the first part being parallel to the upper surface of the substrate, and
  a second part that is disposed on the side surface of the stepped portion and has a second constant thickness measured between the side surface of the stepped portion and a side surface of the second part in the inclined direction, with the side surface of the second part being parallel to the side surface of the stepped portion;
 a first barrier layer disposed on the first buffer layer, the first barrier layer having
  a third part that is disposed on the upper surface of the first part of the first buffer layer, the third part having an upper surface that is parallel to the upper surface of the substrate, and
  a fourth part that is disposed on the side surface of the second part, the fourth part having a side surface that is parallel to the side surface of the stepped portion; and
 a second buffer layer made of the same raw material as the first buffer layer and disposed on the first barrier layer, the second buffer layer having a fifth part that is disposed on the upper surface of the third part of the first barrier layer and has a third constant thickness measured between the upper surface of the third part of the first barrier layer and an upper surface of the fifth part in the thickness direction, with the upper surface of the fifth part being parallel to the upper surface of the stepped portion, and a sixth part that is disposed on the side surface of the fourth part of the first barrier layer and has a fourth constant thickness measured between the side surface of the fourth part of the first barrier layer and a side surface of the sixth part in the inclined direction, with the side surface of the sixth part being parallel to the side surface of the stepped portion, a ratio of the first constant thickness of the first buffer layer in the thickness direction relative to the second constant thickness of the first buffer layer in the inclined direction being closer to 1 than a ratio of the third constant thickness of the second buffer layer in the thickness direction relative to the fourth constant thickness of the second buffer layer in the inclined direction, the first barrier layer having density that is higher than those of the first and second buffer layers, with the first barrier layer being made of different raw material from that of the first and second buffer layers, the first buffer layer having density that is lower than that of the second buffer layer, the second part of the first buffer layer entirely extending along the side surface of the stepped portion, and the sixth part of the second buffer layer entirely extending along the side surface of the fourth part of the first barrier layer.

2. The sealing film according to claim 1, wherein
the buffer layer and the barrier layer are formed by CVD, and
a film formation pressure applied during forming of the first buffer layer is higher than a film formation pressure applied during forming of the second buffer layer.

3. The sealing film according to claim 1, wherein
the buffer layer and the barrier layer are made of different raw materials.

4. A method for forming a sealing film, in which a buffer layer and a barrier layer whose density is higher than that of the buffer layer are alternately formed on a substrate having a stepped portion on an upper surface of the substrate, the upper surface of the substrate facing in a thickness direction of the substrate, the stepped portion having a side surface facing in an inclined direction that is inclined with respect to the thickness direction, the method comprising:

forming a first buffer layer on the substrate, the first buffer layer having
a first part that is disposed on the upper surface of the substrate and has a first constant thickness measured between the upper surface of the substrate and an upper surface of the first part in the thickness direction, with the upper surface of the first part being parallel to the upper surface of the substrate, and
a second part that is disposed on the side surface of the stepped portion and has a second constant thickness measured between the side surface of the stepped portion and a side surface of the second part in the inclined direction, with the side surface of the second part being parallel to the side surface of the stepped portion;

forming a first barrier layer on the first buffer layer, the first barrier layer having a third part that is disposed on the upper surface of the first part of the first buffer layer, the third part having an upper surface that is parallel to the upper surface of the substrate, and
a fourth part that is disposed on the side surface of the second part, the fourth part having a side surface that is parallel to the side surface of the stepped portion; and forming a second buffer layer on the first barrier layer, the second buffer layer being made of the same raw material as the first buffer layer, the second buffer layer having
a fifth part that is disposed on the upper surface of the third part of the first barrier layer and has a third constant thickness measured between the upper surface of the third part of the first barrier layer and an upper surface of the fifth part in the thickness direction, with the upper surface of the fifth part being parallel to the upper surface of the stepped portion, and
a sixth part that is disposed on the side surface of the fourth part of the first barrier layer and has a fourth constant thickness measured between the side surface of the fourth part of the first barrier layer and a side surface of the sixth part in the inclined direction, with the side surface of the sixth part being parallel to the side surface of the stepped portion, the first and second buffer layers and the first barrier layer being formed by CVD with a film formation pressure applied during the forming of the first buffer layer being higher than a film formation pressure applied during the forming of the second buffer layer such that a ratio of the first constant thickness of the first buffer layer in the thickness direction relative to the second constant thickness of the first buffer layer in the inclined direction being closer to 1 than a ratio of the third constant thickness of the second buffer layer in the thickness direction relative to the fourth constant thickness of the second buffer layer in the inclined direction, the first barrier layer having density that is higher than those of the first and second buffer layers, with the first barrier layer being made of different raw material from that of the first and second buffer layers, the first buffer layer having density that is lower than that of the second buffer layer, the second part of the first buffer layer entirely extending along the side surface of the stepped portion, and the sixth part of the second buffer layer entirely extending along the side surface of the fourth part of the first barrier layer.

5. The method for forming a sealing film according to claim 4, wherein
the inclined direction is perpendicular to the thickness direction.

6. The method for forming a sealing film according to claim 4, further comprising
conveying the substrate in a first conveyance direction during the forming of the first buffer layer and the forming of the first barrier layer, the forming of the first buffer layer and the forming of the first barrier layer being performed at a first film formation chamber and a second film formation chamber, respectively,
reversing a conveyance direction of the substrate from the first conveyance direction to a second conveyance direction that is opposite to the first conveyance direction, conveying the substrate in the second conveyance direction during the forming of the second buffer layer after reversing of the conveyance direction of the substrate from the first conveyance direction to the second conveyance direction, the forming of the second buffer layer being performed at the first film formation chamber, and decreasing the film formation pressure applied during the forming of the first buffer layer to the film formation pressure applied during the forming of the second buffer layer in response to the reversing of the conveyance direction of the substrate.

7. The method for forming a sealing film according to claim 4, further comprising decreasing the film formation pressure applied during the forming of the first buffer layer to the film formation pressure applied during the forming of the second buffer layer after the forming of the first barrier layer and before the forming of the second barrier layer.

\* \* \* \* \*